United States Patent [19]

Oliver et al.

[11] Patent Number: 5,504,374

[45] Date of Patent: Apr. 2, 1996

[54] MICROCIRCUIT PACKAGE ASSEMBLY UTILIZING LARGE SIZE DIE AND LOW TEMPERATURE CURING ORGANIC DIE ATTACH MATERIAL

[75] Inventors: Susan A. Oliver, Campbell; Mark R. Schneider, San Jose, both of Calif.

[73] Assignee: LSI Logic Corporation, Milpitas, Calif.

[21] Appl. No.: 196,628

[22] Filed: Feb. 14, 1994

[51] Int. Cl.$^6$ ....................................................... H01L 23/48
[52] U.S. Cl. ............................ 257/746; 257/783; 257/782
[58] Field of Search ....................................... 257/783, 676, 257/782, 746

[56] References Cited

U.S. PATENT DOCUMENTS

| | | | |
|---|---|---|---|
| 4,785,075 | 11/1988 | Shimp | 528/422 |
| 4,839,442 | 6/1989 | Craig, Jr. | 528/422 |
| 5,150,195 | 9/1992 | Nguyen | 257/783 |
| 5,155,066 | 10/1992 | Nguyen | 437/209 |
| 5,195,299 | 3/1993 | Nguyen | 53/428 |
| 5,399,907 | 3/1995 | Nguyen et al. | 257/783 |

OTHER PUBLICATIONS

Sue Oliver et al., "Silver/Polymer Die Attach for Ceramic Package Assembly" Proceedings of the 1992 Int'l Electronics Packaging Society Conference, Sep. 26, 1992.

Primary Examiner—William Mintel
Assistant Examiner—Roy Potter
Attorney, Agent, or Firm—Roms, Smith, Lande & Rose

[57] ABSTRACT

An ASIC type microcircuit package assembly has a die of at least about 20 millimeters square in size and utilizes as a die attach a polymeric adhesive incorporating a conductive filler. Such microcircuit package assemblies are produced by bonding the die to a substrate with the die attach, curing the die attach, and hermetically sealing the die bonded to the substrate. The microcircuit package assemblies thereby produced are characterized by stability at temperatures of up to about 360° C. and under conditions of stress corresponding to a 12 pound pull following 1,000 temperature cycles between −65° and 150° C., and having a moisture level of less than about 5000 ppm.

19 Claims, 1 Drawing Sheet

MICROCIRCUIT PACKAGE ASSEMBLY UTILIZING LARGE SIZE DIE AND LOW TEMPERATURE CURING ORGANIC DIE ATTACH MATERIAL

BACKGROUND OF THE INVENTION

1. Field of the Invention

The present invention relates generally to very large scale integrated circuits and, more particularly, to microcircuit package assemblies.

2. Description of Relevant Art

In the manufacture of semiconductor devices the need for adhering a semiconductor chip, frequently referred to as a "die" to a suitable substrate, such as a metal or ceramic substrate, typically is satisfied by utilizing various types of adhesives, as a so-called "die attach". One type of adhesive which has been used is a silver/glass composition. Other adhesives typically utilized include gold/silicon eutectic formulations and epoxy compositions.

Such previously used adhesives have displayed certain decided disadvantages. For example, gold/silicon eutectics have been limited to die sizes less than about 5 millimeters square, primarily due to lack of process robustness. Epoxy adhesives, although offering some advantages in ease of processing, suffer from significant shortcomings in terms of thermal stability and adhesive strength under conditions of stress. Silver/glass adhesives, which comprise silver and glass particles dispersed in an organic vehicle, require precise temperature profiles to remove the organic vehicle at a controlled rate and to allow the residual silver and glass to bond the die to the substrate. They are suitable only for die sizes up to about 15 millimeters square. Moreover, silver/glass adhesives require curing at relatively high temperatures, in the neighborhood of 425° to 450° C., plus additional oven drying steps.

Recently, rapid curing polymeric adhesives incorporating a conductive filler have been introduced into the marketplace as an improvement over silver/glass adhesives. These adhesive materials are described in U.S. Pat. Nos. 5,150,195, 5,155,066, and 5,195,299 to My N. Nguyen. The adhesive formulations described therein are based upon cyanate esters which are liquid dicyanate monomers of the type described in U.S. Pat. No. 4,785,075 to David A. Shimp and U.S. Pat. No. 4,839,442 to Wallace M. Craig, Jr. The disclosures of these five patents are all, individually and collectively, incorporated herein by reference. The liquid dicyanate monomers are also described in an article entitled "New Liquid Dicyanate Monomer for Rapid Impregnation of Reinforced Fibers" by Shimp and Craig, Jr, presented at the 34th International Sampe Symposium in Reno, Nev., May 8–11, 1989.

The rapid curing adhesive formulations described in the Nguyen patents have been utilized extensively in the mass production of semiconductor devices sized from about 2 to 7 millimeters square. Semiconductor circuit manufacturing, however, increasingly is being directed toward higher integration and higher pin counts as well as specialized purpose semiconductor chips, for which larger dies, on the order of upwards of about 20 millimeters square, are required. Unfortunately, adhering larger sized dies to various substrates has previously resulted in relatively fragile microcircuit package assemblies.

It is accordingly an object of the present invention to provide a microcircuit package assembly in which the bond between the die and substrate is characterized by high thermal stability and excellent strength under conditions of stress.

Another object of this invention is to provide an improved large size ASIC type microcircuit package assembly.

Other objects and advantages of the present invention will become apparent in the course of the following detailed description and disclosure.

SUMMARY OF THE INVENTION

The present invention provides ASIC type microcircuit package assemblies which utilize large size dies, for example, dies at least about 20 millimeters square in size. Such large size microcircuit package assemblies, which are characterized by enhanced stability at elevated temperatures and under stress, are produced by means of a die attach process which utilizes a conductive filler in a polymeric matrix.

The die attach utilized in the present invention is cured at temperatures of about 100° to 150° C. compared to the 420° C. or higher temperatures required for curing silver/glass adhesives. The use of such low curing temperatures reduces cracking of dies due to thermal stress.

While utilizing a low temperature cure which is effective to adhere the die to the substrate is an important consideration, equally important is the capability of the bond between die and substrate to withstand the high temperatures required for sealing microcircuit package assemblies, for which hermetic seals are required. Sealing temperatures as high as about 360° C. can be withstood by the microcircuit package assemblies of the present invention without weakening the bond between the die and the substrate. Furthermore, hermetically sealed microcircuit package assemblies produced in accordance with the present invention have been found to maintain moisture levels of less than about 5000 ppm, which also contributes to their stability.

DESCRIPTION OF EXEMPLARY EMBODIMENTS

Figure 1:
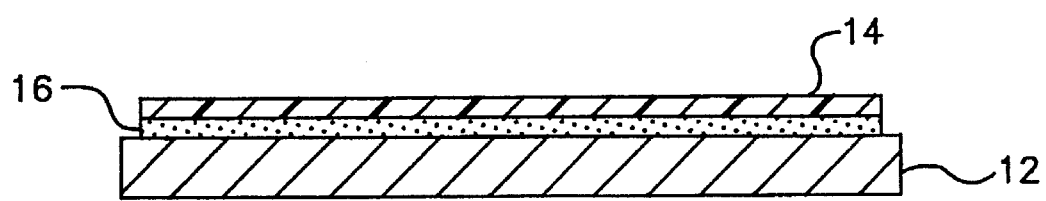
FIG. 1 illustrates a cross-sectional view a microcircuit assembly in accordance with the present invention.

The microcircuit package assembly of the present invention is provided, as shown in FIG. 1, by utilizing a substrate 12, a large size ASIC type microcircuit die 14 and a filled cyanate ester adhesive composition as a die attach 16. Use of the filled cyanate die attach permits curing at temperatures of about 100° to 150° C. Dies adhered to suitable substrates by means of such die attach can then be sealed in ceramic packages or otherwise utilized depending upon need. Even under severe usage conditions, the resulting microcircuit die assembly is found to be extremely stable and to provide dependable service over extended periods of time.

The dies utilized in the present invention are considerably larger than those previously used. While dies no larger than about 15 millimeters square, typically about 2 to 7 millimeters, were used prior to the present invention, dies larger than about 20 millimeters square, preferably 20 to 23 millimeters square, are utilized in the present invention. This is a decided advantage, since even the silver/glass die attach, which required extremely high processing temperatures, was ineffective for bonding dies larger than about 15 millimeters square.

With demands being made upon microcircuit manufacturers to produce dependable microcircuits in which line widths are extremely narrow, the need for reducing microcircuit processing temperatures is becoming critical. Package processing temperatures of about 300° C. or lower must be used with line widths of less than about 1μ, since higher temperatures may destroy such microcircuits by causing the lines, which are necessarily closely spaced, to coalesce, resulting in shorting some circuits.

In the present invention the die, which has been cut to the desired size, for example, by means of a wafer saw, is first attached to a suitable substrate, such as a lead frame or a ceramic package, by means of a filled cyanate ester die attach.

The cyanate ester die attach is formulated from polymers of a family of aryl dicyanate monomers, which polymers contain a reactive cyanate functional group. When heated, the cyanate functionality undergoes an exothermic reaction to form triazine units, resulting in gelation and the formation of thermosetting polycyanurates.

The rapidly curing die attach used in the present invention includes a cyanate ester vehicle which comprises a cyanate ester, an alkylphenol and a metal curing catalyst dissolved in the alkylphenol. Advantageously, the cyanate ester vehicle comprises liquid cyanate ester having a viscosity of about 1 to 5 poise at 25° C. about 2 to 6 parts per hundred (pph) alkylphenol and about 50 to 500 parts per million (ppm) of a metal catalyst. Nonylphenol is the preferred alkylphenol. The metal curing catalyst is a metal naphthenate or acetylacetonate, such as copper naphthenate, zinc naphthenate, copper acetylacetonate, zinc acetylacetonate, cobaltous acetylacetonate, or cobaltic acetylacetonate.

The cyanate ester vehicle is combined with a conductive filler to form a rapidly curing die attach adhesive formulation suitable for attaching a semiconductor device to a substrate in a high speed production process. The adhesive formulation comprises 10–40 wt. % of cyanate ester vehicle and 60 to 90 wt. % of thermally and/or electrically conductive filler. The filler, which may be silver, nickel, or silicon, comprises particulate material of less than 70 microns, preferably 20 microns. The above proportions of cyanate ester vehicle and filler in the adhesive formulation are important in order to achieve satisfactory properties, including a viscosity of about 100 to 1000 poise at 25° C. If less than 60% filler is used, the thermal and/or electrical conductivity as well as viscosity will be too low. The adhesive strength of the adhesive formulation is adversely affected if the filler comprises less than 60% or more than 90% of the formulation. When the filler exceeds 90%, the viscosity is too high for the adhesive formulation to be readily dispensed.

A typical preferred composition is:

| | | |
|---|---|---|
| silver flake | 70–90 wt % | |
| cyanate ester vehicle | 10–30 wt %. | |

In this composition the cyanate ester vehicle contains 100 parts cyanate ester, 2 parts nonylphenol, and 0.06 parts zinc acetylacetonate. A commercially available composition in accordance with the present invention is JM 7000 silver/polymer die attach material available from Johnson Matthey, Inc. of Valley Forge, Pa.

The maximum curing rate of the adhesive formulation recommended by the manufacturer is about 5 minutes at 200° C., preferably about 2 minutes at 200° C. Curing at about 100° to 150° C. is readily accomplished in the present invention by using longer curing times, for example, from about 30 minutes to about 1 hour. Curing at 150° C. for 30 minutes is preferred. An unexpected advantage of using the above described filled cyanate ester die attach is that very little weight loss and outgassing occur during cure.

Following curing the resulting bonded assembly containing the die adhered to a suitable substrate is hermetically sealed to provide the microcircuit package assembly of the present invention. Two common methods of sealing hermetic packages containing semiconductor devices are to braise a lid, such as a gold plated "Kovar" lid, onto the bonded assembly with a suitable gold alloy such as a Au-Sn alloy. Another method is glass sealing. In glass sealing a glass is used to form a sandwiched seal between a ceramic lid and a ceramic substrate. Generally, glass sealing is more popular because of its lower cost. However, current techniques of glass sealing require sealing temperatures well above 400° C. and are therefore not suitable for many applications because such elevated temperatures may damage some semiconductor devices.

The microcircuit package assemblies of the present invention were shown to have exceptional performance properties. Using 20 millimeter square dies and the die attach described above (JM 7000) in ceramic PGA packages, thermal and mechanical stress tests were conducted in accordance with Mil. Std. 883, Method 5011. An adherence test maximum of 200 lb was reached without failure of the die attachment at temperatures of up to 360° C. No degradation of the die attachment was observed.

Long term stability was evaluated under various stress conditions including –65° C. to 150° C. temperature cycling. After 1000 cycles the bonds between microcircuit dies of up to 23 millimeters square and various substrates, including bare alumina, standard multilayer PGA packages, and gold plated nickel on copper/tungsten heat sink slugs remained intact under a 12 lb pull. Furthermore, no degradation of the bond between die and substrate was observed under 220 lb stress after storage at 150° C. for up to 1000 hours.

Residual moisture levels of 500 ppm or less were observed for sealed ceramic microcircuit package assemblies utilizing dies of up to 23 millimeters square.

Thus, the invention provides an ASIC type microcircuit package assembly for dies of up to 23 millimeters square. The package assembly is characterized by enhanced stability and excellent performance over prolonged periods of time.

Having thus described the invention, that which is claimed is:

1. An ASIC type microcircuit package assembly which comprises:

a die at least about 20 millimeters square in size;

a substrate for said die;

a polymeric die attach containing a conductive filler and forming a bond between said die and said substrate, said bond capable of sustaining temperatures of up to at least about 360° C. and stress conditions corresponding to a 12 pound pull following 1,000 temperature cycles between –65° C. and 150° C. after curing of said die attach at a temperature of about 100° C. to 150° C.; and means for hermetically sealing said die bonded to said substrate with a moisture level of less than about 5000 ppm, wherein:

said die attach comprises about 10 to 40 wt % of a cyanate ester vehicle and about 60 to 90 wt % of a conductive filler;

said cyanate ester vehicle comprises a liquid cyanate ester having a viscosity of about 1 to 5 poise at 25° C., about 2 to 6 pph of an alkylphenol, and about 50 to 500 ppm of a catalyst;

said filler comprises particulate material of less than 70 microns;

said die attach has the capability of being cured in about 30 minutes to about 1 hour; and said die attach has a viscosity of about 100 to 1000 poise at 25° C.

2. The microcircuit package assembly of claim 1 wherein said die is sized within the range of about 20 to 23 millimeters square.

3. The microcircuit package assembly of claim 1 wherein said substrate is a ceramic.

4. The microcircuit package assembly of claim 1 wherein said alkylphenol comprises nonylphenol.

5. The microcircuit package assembly of claim 1 wherein said catalyst comprises a member selected from the group consisting of metal carboxylates and metal acetylacetonates.

6. The microcircuit package assembly of claim 1 wherein said catalyst comprises a member selected from the group consisting of cobaltous acetylacetonate and cobaltic acetylacetonate.

7. The microcircuit package assembly of claim 1 wherein said filler comprises a member selected from the group consisting of silver, nickel, silicon, alumina, and aluminum nitride.

8. The microcircuit package assembly of claim 1 wherein said filler comprises particulate material having a maximum particle size of 20 microns.

9. The microcircuit package assembly of claim 1 wherein said die attach has the capability of being cured in about 30 minutes at 150° C.

10. The microcircuit package assembly of claim 1 wherein said filler comprises a member selected from the group consisting of silver, nickel, and silicon, said catalyst comprises a compound of a metal selected from the group consisting of zinc and cobalt, and said die attach has the capability of being cured in about 30 minutes at 150° C.

11. The microcircuit package assembly of claim 1 wherein said filler comprises silver flake, and said die attach has the capability of being cured in about 30 minutes at 150° C.

12. The microcircuit package assembly of claim 1 wherein said filler comprises nickel having a maximum particle size of about 20 microns.

13. The microcircuit package assembly of claim 1 wherein said filler is a thermally conductive filler.

14. The microcircuit package assembly of claim 1 wherein said filler is an electrically conductive filler.

15. The microcircuit package assembly of claim 1 wherein:

said alkylphenol comprises nonylphenol;

said catalyst comprises a member selected from the group consisting of metal carboxylates and metal acetylacetonates; and said filler comprises a member selected from the group consisting of silver, nickel, silicon, alumina, and aluminum nitride.

16. The microcircuit package assembly of claim 1 wherein:

said filler has a maximum particle size of 20 microns and comprises a member selected from the group consisting of silver, nickel, and silicon; and said catalyst is a member selected from the group consisting of zinc acetylacetonate, cobaltous acetylacetonate, and cobaltic acetylacetonate.

17. The microcircuit package assembly of claim 1 wherein said filler comprises silver in an amount of 70 to 90 wt %.

18. The microcircuit package assembly of claim 17 wherein the silver filler comprises silver flake.

19. The microcircuit package assembly of claim 1 wherein said filler comprises a member selected from the group consisting of alumina and aluminum nitride powder.

* * * * *